United States Patent
Nam et al.

(10) Patent No.: US 9,117,512 B2
(45) Date of Patent: Aug. 25, 2015

(54) GATE SHIFT REGISTER AND FLAT PANEL DISPLAY USING THE SAME

(71) Applicant: LG DISPLAY CO., LTD., Seoul (KR)

(72) Inventors: Sang-Jin Nam, Cheonan-si (KR); Chan-Soo Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 57 days.

(21) Appl. No.: 13/725,704

(22) Filed: Dec. 21, 2012

(65) Prior Publication Data

US 2014/0078128 A1   Mar. 20, 2014

(30) Foreign Application Priority Data

Sep. 18, 2012   (KR) .......................... 10-2012-0103190

(51) Int. Cl.

| | | |
|---|---|---|
| *G11C 19/00* | (2006.01) | |
| *G09G 3/20* | (2006.01) | |
| *G11C 19/28* | (2006.01) | |
| *G09G 3/36* | (2006.01) | |
| *G09G 3/32* | (2006.01) | |

(52) U.S. Cl.

CPC *G11C 19/00* (2013.01); *G09G 3/20* (2013.01); *G09G 3/3674* (2013.01); *G11C 19/28* (2013.01); *G09G 3/3266* (2013.01); *G09G 2310/0286* (2013.01); *G09G 2310/0291* (2013.01); *G09G 2310/067* (2013.01)

(58) Field of Classification Search

CPC .......... G11C 19/00; G11C 19/28; G09G 3/20; G09G 3/3674; G09G 3/3266; G09G 2310/0286; G09G 2310/0291; G09G 2310/067; G09G 3/3233

USPC .................... 345/87–104, 204–214, 690–699

See application file for complete search history.

(56) References Cited

U.S. PATENT DOCUMENTS

| | | | | |
|---|---|---|---|---|
| 7,443,372 | B2 * | 10/2008 | Lee et al. ........................ | 345/96 |
| 2002/0089485 | A1 * | 7/2002 | Youn ............................... | 345/99 |
| 2006/0119560 | A1 * | 6/2006 | Jeon ................................ | 345/98 |
| 2006/0279512 | A1 * | 12/2006 | Kim et al. ..................... | 345/100 |
| 2007/0035505 | A1 * | 2/2007 | Lin et al. ....................... | 345/100 |
| 2010/0006783 | A1 * | 1/2010 | Kwon et al. ................... | 250/551 |
| 2010/0260312 | A1 * | 10/2010 | Tsai et al. ........................ | 377/79 |
| 2010/0283777 | A1 * | 11/2010 | Sang et al. ..................... | 345/212 |
| 2011/0012932 | A1 * | 1/2011 | Morimoto ..................... | 345/690 |
| 2011/0157132 | A1 * | 6/2011 | Byun et al. .................... | 345/211 |
| 2012/0019497 | A1 * | 1/2012 | Kim et al. ..................... | 345/210 |

* cited by examiner

*Primary Examiner* — Dmitriy Bolotin

(74) *Attorney, Agent, or Firm* — Birch, Stewart, Kolasch & Birch, LLP

(57) ABSTRACT

Discussed are a gate shift register and a flat panel display using the same. The flat panel display includes a display panel for displaying an image, a gate driver for driving a plurality of gate lines of the display panel, and a timing controller for outputting a gate start pulse and a plurality of clock pulses each having first to third voltages, to control the gate driver. The gate driver includes a gate shift register for generating scan pulses each having the first to third voltages, using the clock pulses, and supplying the generated scan pulses to the gate lines, respectively.

10 Claims, 5 Drawing Sheets

GATE SHIFT REGISTER AND FLAT PANEL DISPLAY USING THE SAME

This application claims the benefit of Korean Patent Application No. 10-2012-0103190, filed on Sep. 18, 2012, which is hereby incorporated by reference as if fully set forth herein.

BACKGROUND OF THE INVENTION

1. Field of the Invention

The present invention relates to a gate shift register and a flat panel display using the same.

2. Discussion of the Related Art

As a flat panel display, there is a liquid crystal display, an organic light emitting diode display, or the like.

Generally, such a flat panel display includes a display panel for displaying an image, a gate driver for supplying a scan pulse to gate lines of the display panel, a data driver for supplying an image signal (data voltage) to data lines of the display panel, and a timing controller for controlling the gate driver and data driver. The gate driver includes a gate shift register for sequentially outputting a scan pulse in response to a gate control signal supplied from the timing controller.

Meanwhile, the recent tendency of such a flat panel display is toward enlargement and high resolution. In a flat panel display having an increased size and a higher resolution, resistance and capacitance components of gate lines are increased, thereby reducing the efficiency of charging and discharging scan pulses. In particular, reduction in scan pulse discharge efficiency causes failure of charging of an image signal in pixels. This causes degradation of picture quality.

As a scheme for solving the above-mentioned problems, there is a method for increasing the size of a switching element constituting an output buffer circuit in the gate shift register. However, this method causes an increase in the size of the gate driver which, in turn, increases costs. Also, in the case of a gate-in-panel (GIP) type gate driver, there is a problem in that it is difficult to design a narrow bezel due to an increase in the area of the GIP gate driver.

SUMMARY OF THE INVENTION

Accordingly, the present invention is directed to a gate shift register and a flat panel display using the same that substantially obviate one or more problems due to limitations and disadvantages of the related art.

An object of the present invention is to provide a gate shift register capable of achieving design of a narrow bezel while enhancing scan pulse discharge efficiency, and a flat panel display using the gate shift register.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flat panel display includes a display panel for displaying an image, a gate driver for driving a plurality of gate lines of the display panel, and a timing controller for outputting a gate start pulse and a plurality of clock pulses each having first to third voltages, to control the gate driver, wherein the gate driver comprises a gate shift register for generating scan pulses each having the first to third voltages, using the clock pulses, and supplying the generated scan pulses to the gate lines, respectively, wherein each of the clock pulses is a signal circularly repeating a first period, in which the clock pulse has the first voltage, a second period, in which the clock pulse has the second voltage, and a third period, in which the clock pulse has the third voltage, and wherein the first voltage is a gate low voltage, the second voltage is a gate high voltage, and the third voltage is a voltage lower than the gate low voltage.

The gate shift register may include a plurality of stages each receiving one of the plural clock pulses, thereby outputting one of the scan pulses. Each of the stages may include a node controller for controlling voltages of first and second nodes in response to a first carry signal from one of the stages preceding the stage and a second carry signal from one of the stages following the stage, and an output buffer for outputting the scan pulse in accordance with voltage stages of the first and second nodes.

The output buffer may include a pull-up switching element for applying, to an output node, the clock pulse input to the stage in accordance with the voltage stage of the first node, and a pull-down switching element for applying the gate low voltage to the output node in accordance with the voltage state of the second node. The voltage applied to the output node may be supplied to respective node controllers of the preceding and following stages as the first and second carry signals.

Each of the clock pulses may be a signal circularly repeating a first period, in which the clock pulse has the first voltage, a second period, in which the clock pulse has the second voltage, and a third period, in which the clock pulse has the third voltage. The first voltage may be a gate low voltage. The second voltage may be a gate high voltage. The third voltage may be a voltage lower than the gate low voltage.

In accordance with the aspects of the present invention, the following effects are provided.

That is, upon discharging a scan pulse from the gate high voltage to the gate low voltage, the gate shift register achieves rapid discharge of the scan pulse through application of a voltage lower than the gate low voltage. Accordingly, the gate shift register has a scan pulse discharge efficiency equal to those of conventional cases while reducing the size and area of the pull-up TFT. In this regard, easy design of a narrow bezel is possible.

Also, the gate shift register achieves an enhancement in discharging efficiency even when an increase in load occurs during driving of an enlarged display panel. In this case, accordingly, it is possible to avoid degradation of picture quality.

In addition, the gate shift register achieves output of scan pulses each having first to third voltages by modulating clock pulses input from outside (timing controller) such that each of the clock pulses has the first to third voltages without requiring a separate circuit configuration. Accordingly, the gate shift register has a simple structure and, as such, the size and area of the gate driver are reduced. Thus, there may be a further advantage in design of a narrow bezel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to the preferred embodiments of the present invention associated with a gate shift register and a flat panel display using the same, examples of which are illustrated in the accompanying drawings.

Figure 1:
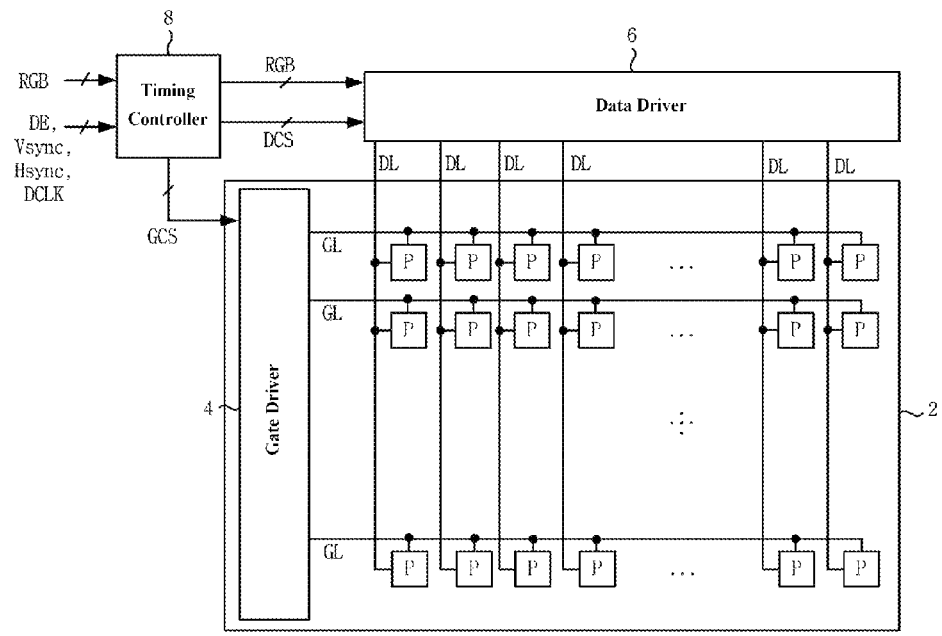
FIG. 1 is a block diagram illustrating a configuration of a flat panel display according to an exemplary embodiment of the present invention.

FIG. 1 is a block diagram illustrating a configuration of a flat panel display according to an exemplary embodiment of the present invention.

The flat panel display shown in FIG. 1 includes a display panel 2, a gate driver 4, a data driver 6, and a timing controller 8.

The display panel 2 includes a plurality of gate lines GL, and a plurality of data lines DL intersecting the gate lines GL. Plural pixels P are provided at intersection regions of the gate lines GL and data lines DL, respectively. Each pixel P displays an image according to an image signal (data voltage) supplied from a corresponding one of the data lines DL in response to a scan pulse Vout supplied from a corresponding one of the gate lines GL.

The gate driver 4 is a gate-in-panel (GIP) type gate driver. The gate driver 4 is formed on a non-display area of the display panel 2. The gate driver 4 includes a gate shift register for supplying scan pulses Vout to the gate lines GL in accordance with a plurality of gate control signals supplied from the timing controller 8. In particular, in accordance with an embodiment of the present invention, the gate shift register receives a plurality of clock pulses CLK each having first to third voltages V1 to V3, and outputs scan pulses Vout 1 to Vout n, each of which has the first to third voltages V1 to V3. Accordingly, it is possible to achieve an enhancement in the efficiency of discharging the scan pulses Vout and easy design of a narrow bezel. The gate shift register described above will be described later in more detail with reference to FIGS. 2 to 5.

The data driver 6 converts digital image data RGB input from the timing controller 8 into a data voltage, using a reference gamma voltage, in accordance with a plurality of data control signals DCS supplied from the timing controller 8. The data driver 6 then supplies the converted data voltage to the data lines DL.

The timing controller 8 aligns the image data RGB input from outside, to match the size and resolution of the display panel 2, and then supplies the aligned image data RGB to the data driver 6. The timing controller 8 generates a plurality of gate signals GCS and a plurality of data signals DCS, using synchronization signals input from outside, for example, a dot clock DCLK, a data enable signal DE, a horizontal synchronization signal Hsync, and a vertical synchronization signal Vsync. The timing controller 8 then supplies the gate and data control signals GCS and DCS to the gate driver 4 and data driver 6, respectively.

The gate control signals GCS include a plurality of clock pulses CLK having different phases, and a gate start pulse Vst instructing driving start of the gate driver 4. The plural clock pulses CLK include two or more clock pulses CLK having different phases. For example, the clock pulses CLK may be 2-phase, 4-phase, 6-phase, 8-phase or more-phase clock pulses CLK. The following description will be given in conjunction with the case in which the clock pulses CLK include 4-phase clock pulses CLK1 to CLK4. The gate start pulse Vst has a gate high voltage (VGH) state once whenever a frame starts. At least one gate start pulse Vst is output in accordance with the phases of the clock pulses CLK. The following description will be given in conjunction with the case in which the gate start pulse Vst includes first and second gate start pulses Vst1 and Vst2.

Figure 2:
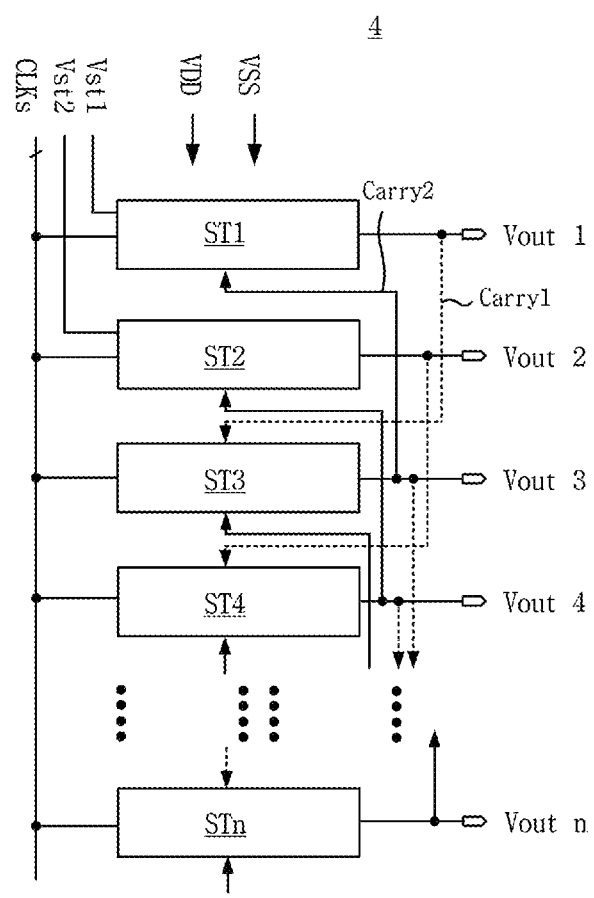
FIG. 2 is a block diagram illustrating a configuration of a gate shift register according to an exemplary embodiment of the present invention.
Figure 3:
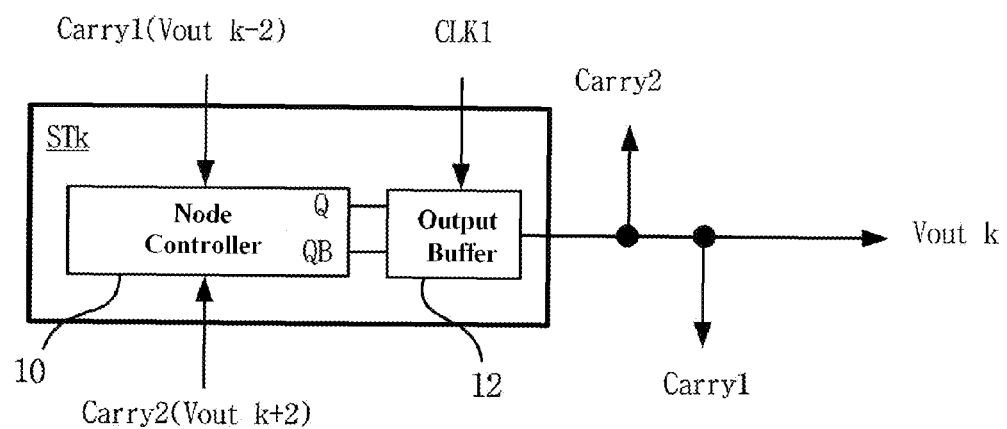
FIG. 3 is a block diagram illustrating a configuration of a k-th stage of the gate shift register.
Figure 4:
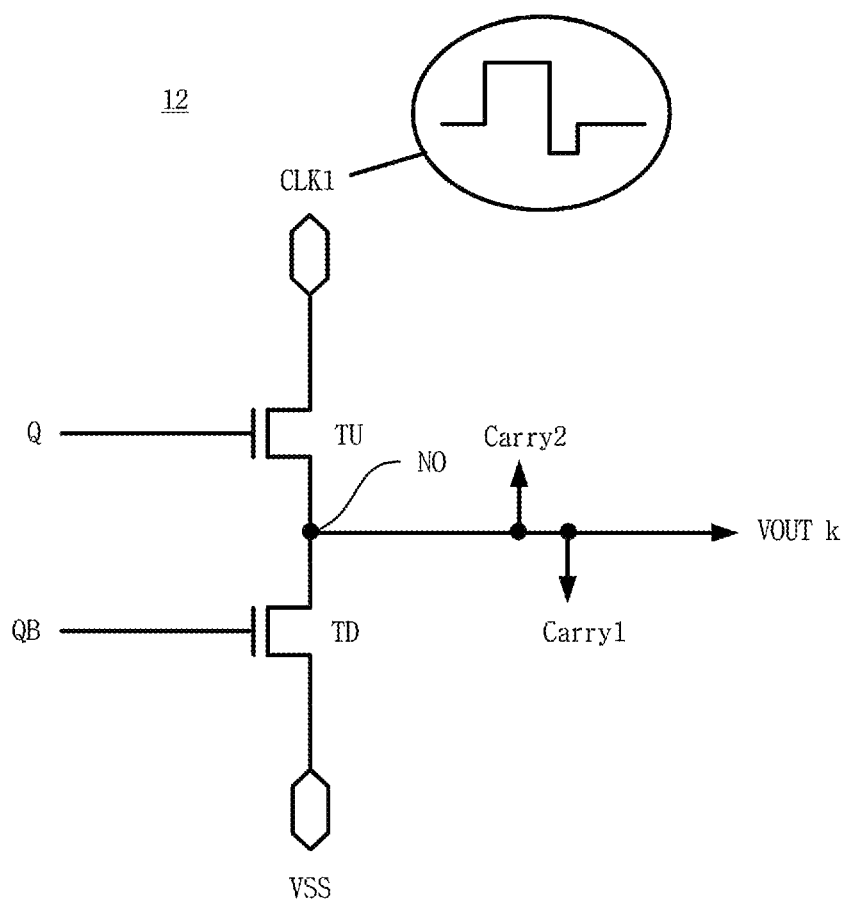
FIG. 4 is a circuit diagram illustrating an output buffer shown in FIG. 3.
Figure 5:
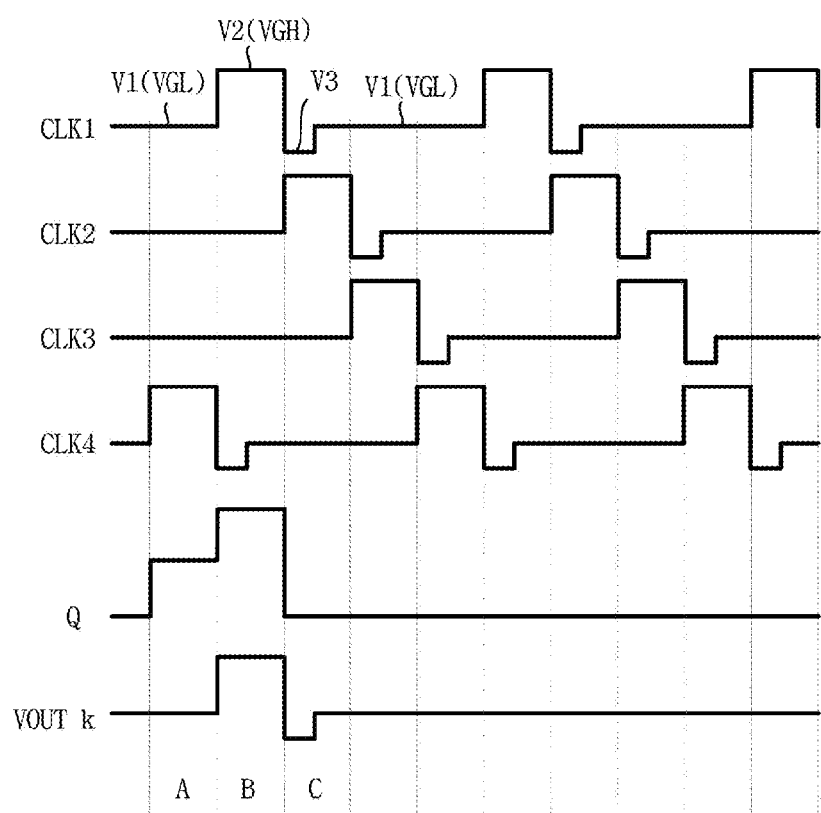
FIG. 5 is a driving waveform diagram of the k-th stage.

FIG. 2 is a block diagram illustrating a configuration of the gate shift register according to an exemplary embodiment of the present invention. FIG. 3 is a block diagram illustrating a configuration of a k-th stage of the gate shift register. FIG. 4 is a circuit diagram illustrating an output buffer 12 shown in FIG. 3. FIG. 5 is a driving waveform diagram of the k-th stage.

Referring to FIG. 2, the gate shift register includes first to n-th stages ST1 to STn, to sequentially output a plurality of scan pulses Vout 1 to Vout n. In response to first and second gate start pulses Vst1 and Vst2, the gate shift register sequentially outputs the scan pulses Vout 1 to Vout n from the first stage ST1 to the n-th stage STn.

The stages ST 1 to STn are grouped such that the stages in each stage group receive different clock pulses, namely, the first to fourth clock pulses CLK1 to CLK4, respectively. Each of the first to fourth clock pulses CLK1 to CLK4 repeats a first period, in which the clock pulse has the first voltage V1, a second period, in which the clock pulse has the second voltage V2, and a third period, in which the clock pulse has the third voltage V3. Here, the first voltage V1 is a gate low voltage VGL for turning off a thin film transistor (hereinafter, referred to as a "TFT"), the second voltage V2 is a gate high voltage VGH for turning on the TFT, and the third voltage V3 is a voltage lower than the gate low voltage VGL. Thus, each of the first to fourth clock pulses CLK1 to CLK4 has the gate low voltage VGL in the first period, increases from the gate low voltage VGL to the gate high voltage VGH in the second period, and decreases from the gate high voltage VGH to a voltage lower than the gate low voltage VGL in the third period. Each of the stages ST1 to STn receives a high-level voltage VDD and a low-level voltage VSS. The high-level voltage VDD is set to a voltage higher than the low-level voltage VSS. The high-level voltage VDD may be the gate high voltage VGH, and the low-level voltage VSS may be the gate low voltage VGL.

Each of the stages ST1 to STn includes two input terminals and one output terminal The stages ST1 to STn output the scan pulses Vout 1 to Vout n through the output terminals thereof, respectively. The scan pulses Vout 1 to Vout n are applied to the gate lines GL of the display panel 2. Each of the scan pulses Vout 1 to Vout n functions as carry signals Carry1 and Carry2 to be transferred to a preceding stage and a following stage, respectively. Here, the "preceding stage" means a stage arranged upstream of a reference stage ST. For example, the preceding stage, which precedes the reference stage, namely, the k-th stage STk (1<k<n), represents one of the first to k-th stages ST1 to STk−1. On the other hand, the "following stage" means a stage arranged downstream of the reference stage ST. For example, the following stage, which follows the reference stage, namely, the k-th stage STk, represents one of the "k+1"-th to n-th stages STk+1 to STn.

Each of the stages ST1 to STn operates in response to the first carry signal Carry1 supplied from the preceding stage and the second carry signal Carry2 supplied from the following stage. Of course, the first and second stages ST1 and ST2 receive the first and second gate start pulses Vst1 and Vst2, respectively, in place of the first carry signal Carry1. Also, the "n−1"-th and n-th stages STn−1 and STn receives a carry signal from a dummy stage (not shown) in place of the second carry signal Carry2.

The stages ST1 to STn have the same circuit configuration, and operation methods thereof are identical. Accordingly, the following description will be given only in conjunction with the k-th stage STk.

Referring to FIG. 3, the k-th stage STk includes a node controller 10 and an output buffer 12.

The node controller 10 includes a plurality of TFTs (not shown) and at least one capacitor (not shown), to control voltages of first and second nodes Q and QB in response to the first and second carry signals Carry1 and Carry2. In response to the first carry signal Carry1, the node controller 10 charges the first node Q with the high-level voltage VDD while discharging the voltage of the second node QB to the low-level voltage VSS. In response to the second carry signal Carry2, the node controller 10 charges the second node QB with the high-level voltage VDD while discharging the voltage of the first node Q to the low-level voltage VSS.

The output buffer 12 receives one of the first to fourth clock pluses CLK1 to CLK4 supplied from the timing controller 8. FIGS. 3 to 5 illustrate the case in which the first clock pulse CLK1 is input to the output buffer 12 of the k-th stage STk. The output buffer 12 applies the first clock pulse CLK1 to an output terminal NO when the charged voltage of the first node Q reaches the high-level voltage VDD. When the charged voltage of the second node QB reaches the high-level voltage VDD, the output buffer 12 discharges the voltage of the output terminal NO to the low-level voltage VSS. For this function, the output buffer 12 includes a pull-up TFT TU and a pull-down TFT TD, as shown in FIG. 4.

The pull-up TFT TU is turned on or off in accordance with the voltage state of the first node Q. When the pull-up TFT TU is turned on, it applies the first clock pulse CLK1 to the output terminal NO.

The pull-down TFT TD is turned on or off in accordance with the voltage state of the second node QB. When the pull-down TFT TD is turned on, it applies the low-level voltage VSS (VGL) to the output terminal NO.

Hereinafter, a driving method of the gate shift register according to the present invention will be described with reference to FIGS. 3 to 5.

The k-th stage STk operates in the order of periods A, B, and C, to output the k-th scan pulse Vout k.

In the period A, the first carry signal Carry1 from the preceding stage is input to the node controller 10. In response to the first carry signal Carry1, the node controller 10 precharges the first node Q with the high-level voltage VDD while discharging the second node QB to the low-level voltage VSS. In this case, the first clock pulse CLK1 has the first voltage V1, namely, the gate low voltage VGL.

In the period B, the first clock pulse CLK1 rises from the gate low voltage VGL to the gate high voltage VGH, and reaches the second voltage V2. Then, the first node Q is boot-strapped by a gate-drain parasitic capacitance of the pull-up TFT TU and, as such, the voltage of the first node Q rises to a voltage higher than the high level voltage VDD. As a result, the pull-up TFT TU is turned on. Accordingly, the first clock pulse CLK1 is supplied to the output terminal NO via the pull-up TFT TU. Thus, the k-th scan pulse Vout k has the gate high voltage VGH.

In the period C, the second carry signal Carry2 from the following stage is input to the node controller 10. In response to the second carry signal Carry2, the node controller 10 discharges the first node Q to the low-level voltage VSS, and applies the high level voltage VDD to the second node QB. Meanwhile, the pull-up TFT TU is maintained in an ON state for a predetermined time until the first node Q is discharged to the low level voltage VSS, and is then turned off. In the period in which the pull-up TFT TU is turned on, the first clock pulse CLK1 has the third voltage V3, namely, a voltage lower than the gate low voltage VGL. The first clock pulse CLK1 is supplied to the output terminal NO via the pull-up TFT TU. Accordingly, the k-th scan pulse Vout k is rapidly discharged from the gate high voltage VGH to the third voltage V4\3, which is lower than the gate low voltage VGL. When the pull-up TFT TU is subsequently turned off, the gate low voltage VGL is supplied to the output terminal NO via the pull-down TFT TD, which is turned on. Accordingly, the k-th scan pulse Vout k has the gate low voltage VGL.

For reference, the size and area of the pull-up TFT TU occupy large portions of the size and area of the GIP gate driver. This is because the clock pulse CLK applied to the drain electrode of the pull-up TFT TU has a high driving voltage and a fast driving frequency. It is also necessary to increase the size and area of the pull-up TFT TU in order to solve problems caused by a load increase of the gate lines GL, for example, a reduction in the efficiency of charging and discharging the scan pulses Vout. However, the increased size and area of the pull-up TFT TU cause an increase in the size and area of the gate driver. As a result, there is an increase in thickness of the bezel.

Upon discharging a scan pulse from the gate high voltage to the gate low voltage, the gate shift register according to the present invention achieves rapid discharge of the scan pulse through application of a voltage lower than the gate low voltage. Accordingly, the gate shift register of the present invention has a scan pulse discharge efficiency equal to those of conventional cases while reducing the size and area of the pull-up TFT. In this regard, easy design of a narrow bezel is possible.

Also, the gate shift register of the present invention achieves an enhancement in discharging efficiency even when an increase in load occurs during driving of an enlarged display panel. In this case, accordingly, it is possible to avoid degradation of picture quality.

In addition, the gate shift register of the present invention achieves outputting of scan pulses each having first to third voltages by modulating clock pulses input from outside (timing controller) such that each of the clock pulses has the first to third voltages without requiring a separate circuit configuration. Accordingly, the gate shift register has a simple structure and, as such, the size and area of the gate driver are reduced. Thus, there may be a further advantage in design of a narrow bezel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flat panel display comprising:
a display panel for displaying an image, the display panel having a plurality of gate lines and data lines defining a plurality of pixel regions, each of the pixel regions having a thin film transistor;
a gate driver for driving the plurality of gate lines of the display panel; and
a timing controller for outputting a gate start pulse and a plurality of clock pulses each having first to third voltages, to control the gate driver, wherein the gate driver comprises a gate shift register for generating scan pulses each having the first to third voltages, using the clock pulses, and supplying the generated scan pulses to the gate lines, respectively,
wherein each of the clock pulses is a signal circularly repeating a first period, in which the clock pulse has the first voltage, a second period, in which the clock pulse has the second voltage, and a third period, in which the clock pulse has the third voltage, and
wherein the first voltage is a gate low voltage for turning off the thin film transistor, the second voltage is a gate high voltage for turning on the thin film transistor, and the third voltage is a voltage lower than the gate low voltage.

2. The flat panel display according to claim 1, wherein:
the gate shift register comprises a plurality of stages each receiving one of the plural clock pulses, thereby outputting one of the scan pulses; and
each of the stages comprises:
a node controller for controlling voltages of first and second nodes in response to a first carry signal from one of the stages preceding the stage and a second carry signal from one of the stages following the stage; and
an output buffer for outputting the scan pulse in accordance with voltage stages of the first and second nodes.

3. The flat panel display according to claim 2, wherein:
the node controller charges the first node with a high-level voltage while discharging a voltage of the second node to a low-level voltage in response to the first carry signal; and
the node controller charges the second node with the high-level voltage while discharging a voltage of the first node to the low-level voltage in response to the second carry signal.

4. The flat panel display according to claim 3, wherein:
the output buffer comprises a pull-up switching element for applying, to an output node, the clock pulse input to the stage in accordance with the voltage stage of the first node, and a pull-down switching element for applying the gate low voltage to the output node in accordance with the voltage state of the second node; and
the voltage applied to the output node is supplied to respective node controllers of the preceding and following stages as the first and second carry signals.

5. The flat panel display according to claim 4, wherein the pull-up switching element is maintained in a turned-on state for a predetermined time in a period in which the node controller discharges the voltage of the first node to the low-level voltage, and is then turned off.

6. A gate shift register comprising:
a plurality of stages each receiving one of a plurality of clock pulses each having first to third voltages, thereby outputting a scan pulse having the first to third voltages to one of a plurality of gate lines in a display panel, the display panel having a plurality of pixel regions, each of the pixel regions having a thin film transistor, wherein each of the clock pulses is a signal circularly repeating a first period, in which the clock pulse has the first voltage, a second period, in which the clock pulse has the second voltage, and a third period, in which the clock pulse has the third voltage, and
wherein the first voltage is a gate low voltage for turning off the thin film transistor, the second voltage is a gate high voltage for turning on the thin film transistor, and the third voltage is a voltage lower than the gate low voltage.

7. The gate shift register according to claim 6, wherein each of the stages comprises:
a node controller for controlling voltages of first and second nodes in response to a first carry signal from one of the stages preceding the stage and a second carry signal from one of the stages following the stage; and
an output buffer for outputting the scan pulse in accordance with voltage stages of the first and second nodes.

8. The gate shift register according to claim 7, wherein:
the node controller charges the first node with a high-level voltage while discharging a voltage of the second node to a low-level voltage in response to the first carry signal; and
the node controller charges the second node with the high-level voltage while discharging a voltage of the first node to the low-level voltage in response to the second carry signal.

9. The gate shift register according to claim 8, wherein:
the output buffer comprises a pull-up switching element for applying, to an output node, the clock pulse input to the stage in accordance with the voltage stage of the first node, and a pull-down switching element for applying the gate low voltage to the output node in accordance with the voltage state of the second node; and
the voltage applied to the output node is supplied to respective node controllers of the preceding and following stages as the first and second carry signals.

10. The gate shift register according to claim 9, wherein the pull-up switching element is maintained in a turned-on state for a predetermined time in a period in which the node controller discharges the voltage of the first node to the low-level voltage, and is then turned off.

* * * * *